US012112732B2

(12) United States Patent
Clark et al.

(10) Patent No.: US 12,112,732 B2
(45) Date of Patent: Oct. 8, 2024

(54) KEYBOARD SENSOR SYSTEMS AND METHODS

(71) Applicant: SONUUS LIMITED, St Neots (GB)

(72) Inventors: James Hastings Clark, St Neots (GB); John Michael McAuliffe, St Neots (GB)

(73) Assignee: SONUUS LIMITED, St Neots (GB)

( * ) Notice: Subject to any disclaimer, the term of this patent is extended or adjusted under 35 U.S.C. 154(b) by 0 days.

(21) Appl. No.: 17/726,190

(22) Filed: Apr. 21, 2022

(65) Prior Publication Data

US 2022/0246122 A1 Aug. 4, 2022

Related U.S. Application Data

(63) Continuation of application No. 16/904,994, filed on Jun. 18, 2020, now Pat. No. 11,657,789, which is a
(Continued)

(30) Foreign Application Priority Data

Dec. 20, 2017 (GB) ..................................... 1721448
Aug. 7, 2018 (GB) ..................................... 1812826

(51) Int. Cl.
*G10H 1/055* (2006.01)
*G10H 1/18* (2006.01)
(Continued)

(52) U.S. Cl.
CPC ............ *G10H 1/0555* (2013.01); *G10H 1/182* (2013.01); *G10H 1/344* (2013.01); *H03K 17/972* (2013.01);
(Continued)

(58) Field of Classification Search
CPC ...... G10H 2220/525; G10H 1/00; G10H 1/32; G10H 1/344; G10H 1/0555;
(Continued)

(56) References Cited

U.S. PATENT DOCUMENTS 3,530,224 A 9/1970 Plunkett et al.
4,425,511 A 1/1984 Brosh
(Continued)

FOREIGN PATENT DOCUMENTS

CN 1987745 A 6/2007
CN 101438222 A 5/2009
(Continued)

OTHER PUBLICATIONS

Notice of Allowance issued in U.S. Appl. No. 16/904,994 dated Feb. 6, 2023.
(Continued)

*Primary Examiner* — Marlon T Fletcher
(74) *Attorney, Agent, or Firm* — ROSSI, KIMMS & McDOWELL LLP

(57) ABSTRACT

A sensing system for a keyboard. Each key sensor comprises passive and active resonant circuits. The passive resonant circuit has a resonant frequency and the active resonant circuit excites the passive resonant circuit at the resonant frequency. A sensor driver drives the active resonant circuit with an RF drive signal, a multiplexing system multiplexes the drive signal such that simultaneously driven key sensors are separated by at least (k−1) keys, and a detector detects a level of RF signal from a driven key sensor for sensing a position and/or velocity of a key.

16 Claims, 11 Drawing Sheets

Related U.S. Application Data continuation of application No. PCT/GB2018/053683, filed on Dec. 19, 2018.

(51) Int. Cl.
*G10H 1/34* (2006.01)
*H03K 17/972* (2006.01)
*H03K 17/97* (2006.01)

(52) U.S. Cl.
CPC . *G10H 2220/221* (2013.01); *G10H 2220/271* (2013.01); *G10H 2220/275* (2013.01); *H03K 2017/9706* (2013.01)

(58) Field of Classification Search
CPC ....... G10H 2220/275; G10H 2220/271; G10H 2220/221; G10H 3/143; G10H 1/182; G10H 2220/505; G10H 3/181; G10H 3/186; G10H 3/12; G10H 7/008; G10H 1/06; G10H 1/34; G10H 1/02
See application file for complete search history.

(56) References Cited

U.S. PATENT DOCUMENTS

| | | | |
|---|---|---|---|
| 4,580,478 A | 4/1986 | Brosh | |
| 4,838,139 A | 6/1989 | Fiori, Jr. | |
| 4,852,443 A | 8/1989 | Duncan | |
| 4,980,519 A | 12/1990 | Mathews | |
| 5,129,654 A | 7/1992 | Bogner | |
| 6,150,600 A | 11/2000 | Buchla | |
| 6,153,822 A | 11/2000 | Toba et al. | |
| 6,859,541 B1 | 2/2005 | Hilton | |
| 7,538,268 B2 | 5/2009 | Marcus | |
| 7,667,129 B2 | 2/2010 | Chidlaw et al. | |
| 7,952,519 B1 | 5/2011 | Nielsen | |
| 8,207,729 B2 | 6/2012 | Erickson | |
| 8,690,670 B2 | 4/2014 | Kay | |
| 8,922,399 B2 | 12/2014 | Bajaj | |
| 8,933,314 B2 | 1/2015 | Clark | |
| 9,336,761 B1 | 5/2016 | Marquez et al. | |
| 10,049,651 B1 | 8/2018 | Matsunaga | |
| 11,449,152 B2 | 9/2022 | Clark et al. | |
| 2002/0140419 A1 | 10/2002 | Duret | |
| 2004/0056781 A1 | 3/2004 | Rix | |
| 2004/0069856 A1 | 4/2004 | Held | |
| 2006/0114129 A1 | 6/2006 | Henty | |
| 2006/0278068 A1 | 12/2006 | Nielsen et al. | |
| 2007/0181410 A1 | 8/2007 | Baier | |
| 2009/0033627 A1 | 2/2009 | Aasen | |
| 2009/0128337 A1 | 5/2009 | Oberle | |
| 2009/0282962 A1 | 11/2009 | Jones | |
| 2011/0102259 A1 | 5/2011 | Ledvina | |
| 2011/0179939 A1 | 7/2011 | Ribner | |
| 2011/0187204 A1 | 8/2011 | Lacey et al. | |
| 2012/0055320 A1 | 3/2012 | Morong | |
| 2012/0212241 A1 | 8/2012 | Wallace et al. | |
| 2013/0002477 A1 | 1/2013 | Dehnie | |
| 2013/0055879 A1 | 3/2013 | Clark et al. | |
| 2013/0093436 A1 | 4/2013 | Thorn | |
| 2013/0139672 A1 | 6/2013 | Ribner | |
| 2013/0287227 A1 | 10/2013 | Wallander | |
| 2014/0274395 A1 | 9/2014 | Ellsworth | |
| 2015/0170625 A1 | 6/2015 | Clark | |
| 2016/0093278 A1 | 3/2016 | Esparza | |
| 2017/0031050 A1 | 2/2017 | Lisi | |
| 2018/0033262 A1 | 2/2018 | Shah et al. | |
| 2018/0217668 A1 | 8/2018 | Ligtenberg et al. | |
| 2019/0094984 A1 | 3/2019 | Lin | |
| 2020/0320966 A1* | 10/2020 | Clark | H03K 17/972 |
| 2021/0151020 A1* | 5/2021 | Tanoue | G10H 1/346 |
| 2021/0294431 A1 | 9/2021 | Clark | |
| 2021/0304718 A1 | 9/2021 | Clark | |
| 2022/0270580 A1 | 8/2022 | Ishii et al. | |
| 2022/0277717 A1 | 9/2022 | Miyoshi | |
| 2023/0013774 A1 | 1/2023 | Ishii et al. | |
| 2023/0197044 A1 | 6/2023 | Clark et al. | |

FOREIGN PATENT DOCUMENTS

| | | | | |
|---|---|---|---|---|
| CN | 103890837 A | | 6/2014 | |
| CN | 205942706 U | | 2/2017 | |
| CN | 107093420 A | | 8/2017 | |
| CN | 114651302 A | | 6/2022 | |
| CN | 115298510 A | * | 11/2022 | ............. G01D 5/204 |
| DE | 202018006116 U1 | | 4/2019 | |
| EP | 0103066 A2 | | 3/1984 | |
| EP | 3096457 A1 | | 11/2016 | |
| EP | 3208796 A1 | | 8/2017 | |
| EP | 3291223 A1 | | 3/2018 | |
| FR | 1504649 A | | 12/1967 | |
| GB | 2320125 A | | 6/1998 | |
| GB | 2482651 A | | 2/2012 | |
| GB | 2494230 A | * | 3/2013 | ........... G01D 5/2066 |
| GB | 2530117 A | | 3/2016 | |
| GB | 2569578 A | * | 6/2019 | ........... G01D 5/2066 |
| GB | 2569578 B | * | 7/2020 | ........... G01D 5/2066 |
| GB | 2580542 A | | 7/2020 | |
| GB | 2570533 B | * | 9/2021 | ........... G01D 5/2006 |
| JP | H01500694 A | | 3/1989 | |
| JP | H1020977 A | | 1/1998 | |
| JP | 2004087250 A | | 3/2004 | |
| JP | 2008033112 A | | 2/2008 | |
| JP | 2017532614 A | | 11/2017 | |
| KR | 1020010005739 A | | 1/2001 | |
| KR | 1020020004727 A | | 1/2002 | |
| KR | 1020180012716 A | | 2/2018 | |
| WO | 8705732 A1 | | 9/1987 | |
| WO | 9843218 A1 | | 10/1998 | |
| WO | 0203373 A1 | | 1/2002 | |
| WO | 2004025402 A2 | | 3/2004 | |
| WO | 2011128698 A1 | | 10/2011 | |
| WO | WO-2019122867 A1 | * | 6/2019 | ........... G01D 5/2006 |
| WO | 2020030911 A1 | | 2/2020 | |
| WO | 2020030912 A1 | | 2/2020 | |
| WO | WO-2021100448 A1 | * | 5/2021 | ............. G01D 5/204 |
| WO | WO-2021100472 A1 | * | 5/2021 | ........... G10H 1/0008 |
| WO | WO-2021182409 A1 | * | 9/2021 | |
| WO | WO-2021193389 A1 | * | 9/2021 | ............. G01D 5/204 |
| WO | WO-2022101046 A1 | * | 5/2022 | ............. A63F 13/20 |

OTHER PUBLICATIONS

Extended European Search Report issued in European Appln. No. 22160075.2 dated Jun. 22, 2022.

Extended European Search Report issued in European Appln. No. 22160076.0 dated Jun. 13, 2022.

Notice of Allowance issued in U.S. Appl. No. 17/266,446 dated Jun. 17, 2022.

Notice of Allowance issued in U.S. Appl. No. 17/266,479 dated Jul. 21, 2022.

Combined Search and Examination Report issued in GB Appln. No. 1721448.7 dated Jun. 20, 2018.

Combined Search and Examination Report issued in GB Appln. No. 1812826.4 dated Jan. 31, 2019.

International Search Report issued in Intl. Appln. No. PCT/GB2018/053683 dated May 22, 2019.

Written Opinion issued in Intl. Appln. No. PCT/GB2018/053683 dated May 22, 2019.

Combined Search and Examination Report issued in GB Appln. No. 1918915.8 dated May 5, 2020.

Office Action issued in U.S. Appl. No. 17/266,479 dated Mar. 3, 2022.

Notice of Allowance issued in U.S. Appl. No. 17/266,446 dated Mar. 9, 2022.

Office Action issued in U.S. Appl. No. 17/266,446 dated Nov. 16, 2021.

Search Report issued in GB Appln. No. 1909214.7 dated Dec. 23, 2019.

(56) References Cited

OTHER PUBLICATIONS

International Search Report issued in Intl. Appln. No. PCT/GB2019/052220 dated Nov. 5, 2019.
Written Opinion issued in Intl. Appln. No. PCT/GB2019/052220 dated Nov. 5, 2019.
International Search Report issued in Intl. Appln. No. PCT/GB2019/052221 dated Oct. 29, 2019.
Written Opinion issued in Intl. Appln. No. PCT/GB2019/052221 dated Oct. 29, 2019.
Office Action issued in Japanese Appln. No. 2021-506323 mailed Aug. 8, 2023. English machine translation provided.
Office Action issued in Chinese Appln. No. 201980052638.0 mailed Aug. 26, 2023. English translation provided.
Office Action issued in U.S. Appl. No. 14/567,672 mailed Feb. 12, 2016.
Search Report issued in GB Appln. No. 1115184.2 mailed Dec. 21, 2011.
Search Report issued in GB Appln. No. 1208162.6 mailed Dec. 24, 2012.
Office Action issued in Chinese Appln. No. 201880083102.0 mailed Dec. 14, 2023. English machine translation provided.
Office Action issued in Chinese Appln. No. 201980053464.X mailed Nov. 25, 2023. English machine translation provided.
Office Action issued in Korean Appln. No. 10-2021-7006572 mailed Jun. 24, 2024. English translation provided.

* cited by examiner

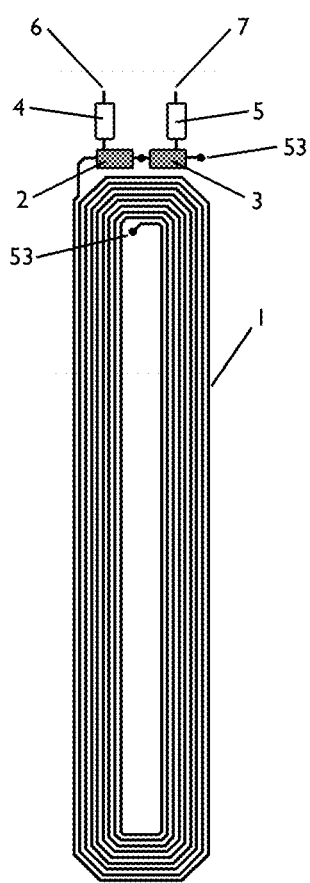
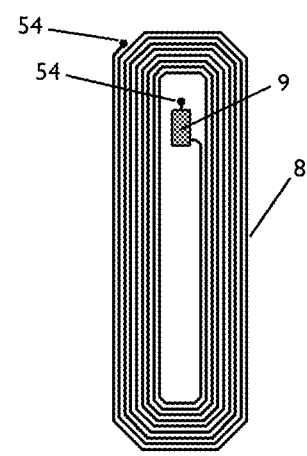
FIG. 3A
FIG. 3B

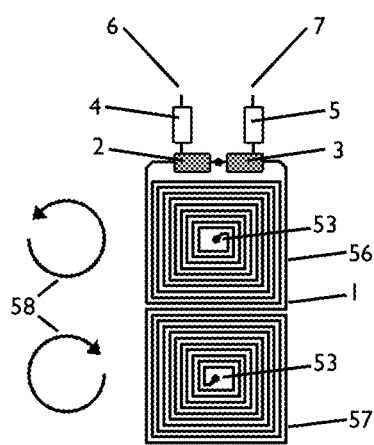
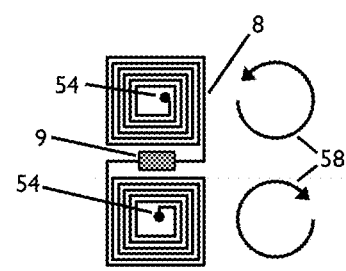
FIG. 13A
FIG. 13B

KEYBOARD SENSOR SYSTEMS AND METHODS

FIELD OF THE INVENTION

The invention relates to sensing systems and methods for keyboards such as musical instrument keyboards.

BACKGROUND

The applicant has previously described resonant circuit-based sensors in GB2494230A.

Musical keyboards for electronic instruments generally use a mechanical switch or similar contacting device to sense a single striking position of a key wherein the closing of the switch is used to detect a note-on event and the opening of the switch is used to detect a note-off event. More sophisticated versions of such instruments may use a plurality of such switches.

Using mechanical sensors such as switches to sense the position of a key on a musical keyboard has many disadvantages. Most musical keyboards feature a large number of keys, typically from 21 to 88 keys. To support such a large number of keys the switches are commonly time-interleaved using a multiplexing method. Such a multiplexing method combined with connection jitter of the switches, also known as switch bounce, limits the speed at which the switches' connection and disconnection points can be detected. In some cases the connection and disconnection of the switches can be felt by the musician, which is highly undesirable. In other cases the switches can become unreliable due to mechanical wear unless high-reliability switches are used, but such switches are expensive. In all cases mechanical variations between the switches causes variations in the response from one key to another key. Such variations are very difficult to remove by a calibration procedure because variation also occurs on an individual key when the key is actuated repeatedly. Furthermore, it is not possible to change the point during the movement of the key at which a switch connects and disconnects without a mechanical change.

More advanced musical keyboards permit the pressure applied to the key after the note-on event has been issued to be used to control aspects of the musical sound. This pressure can be detected by a single pressure sensor element, for example a force-sensing resistor, where the pressure from all the keys on the keyboard is combined by mechanical coupling to exert pressure on the pressure sensor. Such a system is commonly referred to as monophonic aftertouch. A more desirable system permits the pressure applied to each individual key to be detected independently; this is referred to as pressure, or polyphonic aftertouch. Such a polyphonic aftertouch system is expensive because a separate pressure sensor is used for each individual key.

Alternative detection methods for musical keyboards are known which overcome many of the limitations of mechanical switches and pressure sensors, however these all still have undesirable properties.

Optical position sensing of a piano keyboard is described in US 2009/0282962. However the performance of such systems is vulnerable to degradation by contamination and they need to be cleaned, or recalibrated to retain optimal performance. Moreover, they can contain delicate optical elements such as shades or films with graduated transparency or reflectivity, which make them sensitive to shock and vibration with a corresponding reduction in long-term reliability. Furthermore, US2009/0282962 has an optical sensor and op-amp for each key which makes such an implementation expensive.

Magnetic sensors such as Hall probes where a permanent magnet is moved with respect to the Hall probe are another way to detect the position of a key on a musical keyboard. However such magnetic sensors are sensitive to interference from external magnetic fields, to interference from movement of nearby ferrous metals, and to changes in temperature, and the sensors experience hysteresis which limits the accuracy and repeatability of position sensing. Furthermore, the requirement of a permanent magnet and a magnetic sensor on each key makes such a solution too expensive for most applications.

Capacitive position sensors are too sensitive to electromagnetic interference and to the position of the musician's hands, and to temperature, which make their application for a musical keyboard impractical.

U.S. Pat. No. 4,838,139 describes a musical keyboard with inductive coil sensors. In this arrangement each key carries a metal spoiler which moves towards/away from its associated sensor inductance coil. However the system is slow, too slow than desirable for an 88-note keyboard, and is affected by metal jewellery, and casework of the product and supporting structures.

SUMMARY OF THE INVENTION

There is described a set of sensors for a keyboard, in particular the keyboard of a keyboard instrument, in particular a piano-style keyboard. The keyboard has a plurality of keys. The set of sensors may be part of a sensing system. Each sensor may comprise a passive resonant circuit for mounting on a moving part of a key and an active resonant circuit for mounting in a fixed, reference position, for example on part of the keyboard or instrument. In implementations the passive resonant circuit has a resonant frequency and the active resonant circuit excites the passive resonant circuit at the resonant frequency. Each sensor may further comprise a detector, which may be shared between multiple sensors, to detect variation of a resonant signal in the active resonant circuit with relative position of the active and passive resonant circuits to thereby detect a position and/or velocity of the key. The variation may, in some implementations, be a variation in amplitude of signal in the resonant signal. The set of sensors may comprise sensors having two or more different resonant frequencies arranged such that sensors having the same resonant frequency are non-adjacent when mounted to sense keys of the keyboard. Additionally or alternatively the one or more coils of at least the active resonant circuits, and optionally also of the passive resonant circuits, may have windings in opposite senses to reduce interference between sensors.

In some implementations, the system may be configured to provide polyphonic aftertouch by distinguishing between at least three different key positions, a first, note-off position, a second, note-on position, and a third, aftertouch position, wherein the aftertouch position is beyond the note-on position and corresponds to additional pressure applied to the key after depression and movement of a key beyond an end-stop position.

In implementations, one or more of the active resonant circuits may comprise more than one coil and optionally the coils of the active resonant circuit may be positioned next to one another along the longitudinal direction defined by the key, such that the positioned coils define a major length along the longitudinal direction and define a minor length perpendicular to the longitudinal direction. The one or more coils of the active resonant circuit may further comprise two primary coils with opposing winding directions.

In implementations that passive resonant circuit may comprise one or more coils, optionally with the one or more coils having opposing winding directions. Optionally the one or more coils of the passive resonant circuit may comprise two secondary coils wired in series with opposing winding directions. The secondary coils of the passive resonant circuit may be primarily inductively coupled to different coils of the active tuned resonant circuit respectively.

In implementations the active resonant circuits of adjacent keys may be offset relative to an axis defined by the arrangement of the plurality of keys. For example, an active resonant circuit of a first key of the plurality of keys and an active resonant circuit of a second key of the plurality of keys to be on either side of said axis are offset on either side of said axis.

There is also described a method of sensing the positions of a plurality of keys, for example of a keyboard instrument. The method may comprise providing each key with a sensor comprising a passive resonant circuit for mounting, for example, on a moving part of a key and an active resonant circuit for mounting, for example, in a fixed, reference position, for example part of the keyboard or instrument. In some implementations the passive resonant circuit has a resonant frequency, the active resonant circuit exciting the passive resonant circuit at the resonant frequency. Each sensor may further have a detector, which may be shared, to detect variation of a resonant signal in the active resonant circuit with relative position of the active and passive resonant circuits to detect a position and/or velocity of the key. The method may further comprise arranging the sensors to operate at two or more different resonant frequencies arranged such that keyboard sensors having the same resonant frequency are non-adjacent. Additionally or alternatively and/or the method may further comprise reducing interference between sensors by configuring one or more coils of at least the active resonant circuits, and optionally also of the passive resonant circuits, to have windings in opposite senses.

In one aspect there is provided a sensing system for a keyboard, for example a musical instrument keyboard such as a piano-style keyboard. The sensing system may comprise a plurality of key sensors. Each key sensor may comprise a passive resonant circuit, for example for mounting on a moving part of a key, and an active resonant circuit, for example for mounting in a reference position. In implementations the passive resonant circuit has a resonant frequency and the active resonant circuit is configured to excite the passive resonant circuit at the resonant frequency. The sensing system may further comprise at least one sensor driver to drive the active resonant circuit with an RF drive signal; this may be shared between multiple sensors. In implementations the sensing system may further comprise a multiplexing system, such as one or more multiplexers and/or demultiplexers, to multiplex the drive signal such that simultaneously driven key sensors are (physically) separated by at least (k−1) keys, where (k−1) is an integer equal to or greater than 1. Thus in implementations one key is not driven at the same time as an adjacent key (or at the same time as a key at least k keys away). The sensing system may further comprise at least one detector, for example readout-circuitry and/or a microprocessor, to detect a level of RF signal from a driven key sensor. This may be used for sensing a position and/or velocity of a key associated with the key sensor. The at least one detector may detect variation of a resonant RF signal in the active resonant circuit with relative position of the active and passive resonant circuits; it may peak-detect the level of RF signal.

At least the active resonant circuit, and optionally also the passive resonant circuit, may comprise one, two or more coils, in particular with windings in opposite senses. Thus, for example, the windings may generate magnetic fields in opposite senses, in particular balanced or matched to cancel one another, in particular at long distances from the sensor In implementations the combination of coils with opposite sense windings (and hence opposite sense currents/magnetic fields) and multiplexed sensor addressing facilitates the use of multiple sensors in close proximity. Thus in implementations the windings in opposite senses are configured to generate balanced magnetic fields in opposite senses, which may cancel one another substantially completely at large distances from a sensor, for example at a distance of at least ten times a maximum coil dimension (which is not to say that the RF field from a sensor is undetectable at such a distance).

In some implementations the active resonant circuit comprises a pair of, or three or more, laterally adjacent pancake coils. (As used herein references to two or more coils may be taken to include one coil with two or more windings, for example where the windings are in opposite senses). The coils may be positioned next to one another longitudinally along a longitudinal direction defined by a key. The pancake coils may be formed on a printed circuit board (PCB), which may be a flexible PCB, for ease of fabrication. The coils may, but need not have windings in opposite senses—some reduction in mutual interference may be obtained simply by employing this configuration of coils.

In implementations system, in particular the multiplexing system, is configured to damp the active resonant circuits of key sensors which are not driven, for example by shorting a coil/sensor and/or driving it with an off-resonance signal, e.g. a low frequency or DC signal. This also facilitates using resonant circuit-based sensors by reducing interference between sensors.

One or more of the above described techniques may be employed to limit interference between nearby sensors. Which, and how many, techniques are employed may depend in part upon the distance between the active and passive resonant circuits when a key is up and/or the distance of travel between key up and key down positions. For example in a piano-style keyboard the travel may be in the approximate range 5 mm to 15 mm depending upon the design. With larger distances pressing one key may result in seeing another nearby key move, and thus one or more of the above techniques may be beneficially employed to ameliorate this effect. Thus in general, some implementations of the sensing system may employ a multiplexing arrangement as described herein and some additional means to reduce interference between nearby sensors.

The sensing system may further comprise a temperature-compensation system to temperature-compensate the detected level of RF signal. The temperature-compensation system may be configured to apply an off-resonance drive signal to at least one of the active resonant circuits. It may then measure a level of the off-resonance drive signal from the at least one detector, and it may then compensate (e.g. offset) the detected level of RF signal responsive to the level of the off-resonance drive signal. In some implementations the multiplexing system is configured to multiplex the drive signal such that one of the key sensors is driven in each of a set of time slots. Then the temperature-compensation system may be configured to apply the off-resonance drive signal during an additional time slot, in particular a time slot not used for key interrogation.

In some implementations each key sensor may further comprises a resilient deformable element, for example below one of the resonant circuits, for example a deformable end stop, or between the resonant circuits, in particular to limit motion of one or both of the passive resonant circuit and the active resonant circuit for pressure sensing, in particular by detecting motion against the resilient deformable element.

In a related aspect there is provided a method of periodically compensating a response of a keyboard. Each key of the keyboard may have a sensor comprising an active resonant circuit, a passive tuned resonant circuit and a detector. The method may comprise retrieving from storage a detected initial output signal of the sensor, $O_{r0}$, at a first time, $t_0$, wherein at $t_0$ the active resonant circuit is being driven at a frequency below a resonant frequency of the active resonant circuit. The method may further comprise, periodically, for at least one of the sensors, detecting a later output signal of the sensor, $O_{r1}$, at a time after $t_0$. The method may then calculate an adjustment value, for example a difference between the initial output signal of the sensor and the later output signal of the sensor. The method may then further comprise compensating the response of the keyboard by adjusting an operational output of the sensor using the adjustment value. The operational output may be an output from the sensor when the active resonant circuit is being driven at the resonant frequency of the active resonant circuit. The method may further comprise operating the sensor according to a time division multiplexed addressing scheme. The method may then use a "spare" time slot of the time division multiplexed addressing scheme, in which the sensor is not operational, for the detecting.

In another aspect there is provided a set of sensors for a keyboard, in particular the keyboard of a keyboard instrument, in particular a piano-style keyboard. The keyboard has a plurality of keys. The set of sensors may be part of a sensing system. Each sensor may comprise a passive resonant circuit for mounting on a moving part of a key and an active resonant circuit for mounting in a fixed, reference position, for example on part of the keyboard or instrument. In implementations the passive resonant circuit has a resonant frequency and the active resonant circuit excites the passive resonant circuit at the resonant frequency. Each sensor may further comprise a detector, which may be shared between multiple sensors, to detect variation of a resonant signal in the active resonant circuit with relative position of the active and passive resonant circuits to thereby detect a position and/or velocity of the key. The variation may, in some implementations, be a variation in amplitude of signal in the resonant signal. The set of sensors may comprise sensors having two or more different resonant frequencies arranged such that sensors having the same resonant frequency are non-adjacent when mounted to sense keys of the keyboard.

Embodiments of this approach can be relatively inexpensive to construct but are also reliable and not prone to the key bounce of mechanical switches, which in turn enables them to respond to key movements very quickly and reliably. For example ideally each key would be measured at a rate of at least 250 times per second, and on an 88-note keyboard this corresponds to 22,000 keys/second. Some implementations of the described system can operate at well over ten times this speed. Embodiments of the system can also provide excellent temperature stability, and are non-contact so robust and substantially immune to contamination. Some implementations of the sensors are further able to determine a key position as it moves between key pressed and key released positions, and may provide a substantially continuous determination of key position. The reference position may be a fixed position beneath the key, for example on a keyboard base or mount or it may be a position on a printed circuit board (PCB) carrying the set of sensors for the keyboard. Alternatively however, in some implementations the active resonant circuit may be mounted on or in association with a key and the resonant circuit may be mounted on the base, PCB or similar.

Some implementations of the sensors are also able to detect when a key moves beyond a key pressed position, and hence are useful in implementing polyphonic aftertouch. Aftertouch allows a musician to apply force to a key after depression to add expression to a note by modifying the note, for example to control volume, vibrato and the like. In some implementations polyphonic aftertouch allows a musician to control this expression for each key separately.

The sensors can further sense key velocity, and/or sensed key velocity may be employed to determine key position. Sensing key velocity may allow further expression to be added.

In some implementations sensors having a first resonant frequency are interleaved with sensors having a second, different resonant frequency, for example using alternate frequencies on alternate keys. This helps to reduce inter-sensor interference.

The set of sensors may include a controller to control selection or scanning of the sensors such that adjacent keyboard sensors are selected at different times, again to reduce inter-sensor interference. In some implementations the controller may damp the response of active resonant circuits of unselected sensors, for example by connecting part of the active resonant circuit to ground, for example via a resistor. The controller may comprise a multiplexing system and/or a microprocessor.

In some implementations the controller/multiplexing system may be configured to time division multiplex operation of the sensors. In such an approach each resonant frequency may define a group of sensors, and the time division multiplexing may define a plurality of n time slots. Successive keyboard sensors, for example of each group, are allocated successive time slots. The successive sensors, for example of each group, may be non-adjacent on the keyboard if sensors of the groups of sensors are interleaved. There may be N resonant frequencies and thus N groups of sensors; In some implementations N=1. In some implementations, after activating a sensor of a current group of sensors in a current time slot the controller may in the next time slot activate the next sensor along the keyboard which is in the same group of sensors.

Preferably the controller/multiplexing system is configured such that adjacent sensors are not active simultaneously, although next-to-adjacent sensors may be active simultaneously. The spacing between simultaneously active sensors may be (m×N)+1 where m is in the range 1 to n/2; higher separations are preferred (where a spacing of 1 refers to adjacent sensors).

The closest physical spacing for simultaneously active sensors in the same group may be a spacing of n×N sensors, later referred to as a subset of sensors, since typically a keyboard will have more than one such subset. Thus the controller/multiplexing system may be configured such that keyboard sensors in the same group and activated in the same time slot have (n×N)−1 sensors between them. In some implementations n may be 8 and N may be 2.

The controller may be implemented using a processor coupled to an addressing device such as a digital demultiplexer to address the sensors; a signal may be read from the addressed sensors by selectively connecting a sensor active resonator to a read-out circuit via an analogue multiplexer. The detector, i.e. read-out circuit, may perform an envelope detect function. The read-out circuit and/or analogue multiplexer may be enabled by an enable signal derived from a drive signal to an active resonator, in some implementations via an adjustable phase shift. The adjustable phase shift may be used, in the context of or separately from such a demultiplexer-multiplexer arrangement, to implement synchronous detection of the signal from an active resonant circuit.

The controller or another processor may be configured to process the variation of the resonant signal in the active resonant circuit of each sensor to determine the motion of each key of the keyboard over a succession of time intervals as a depressed key moves between released and depressed positions, when a key is depressed and/or released. The motion of each key may comprise a position and/or an approximate velocity of the key as the key moves between released and depressed positions.

In some approaches the position of a key may be determined from the velocity of a key, for example by integration, rather than directly. The processor may output data defining a profile of approximate position and/or velocity over time for each key or for each moving key.

In some implementations the processor is configured to process the variation of the resonant signal in the active resonant circuit of each sensor to determine the approximate velocity of a key from changes in position of the key determined at successive time intervals. A velocity determined in this way may be filtered dependent upon key velocity, for example applying greater filtering/smoothing when a key is moving slowly. This helps to provide accurate data when a key is moving slowly without significantly compromising the response time for a fast-moving key.

More generally a processor may process the amplitude and/or other variation of the resonant signal to determine a key press and key release event for each key, for example from a determination of key position and/or velocity. The processor may thus output a note signal for each key/each active key.

In some approaches the succession of key positions or key movement profile may be used to predict when a pressed (or released) key reaches a key-press/note-on (or key-release/note-off) position, for example by extrapolating a trajectory of the key position. The predicted position may be the position later referred to as K. The processor may then issue a key-press/note-on (or key-release/note-on signal in advance of the actual key-press/note-on (or key-release/note-on position being reached. This can be advantageous for compensating in processing delays in the instrument, for example latency in the sound generation engine.

In some implementations the succession of key positions or key movement profile may be used to provide signals to control the instrument, for example to control the sound generation engine to add expression to the sounds, before and/or after a note-on event has been issued.

In some implementations the processor may be further configured to distinguish between at least three different key positions, a first, note-off position, a second, note-on position, and a third, aftertouch position. The aftertouch position may be beyond the note-on position and correspond to additional pressure applied to the key after depression. The processor may determine a position and/or velocity of the key as it moves to/from the aftertouch position, for example to act as a variable pressure sensor, or the processor may simply identify when the aftertouch position is reached. The aftertouch position may correspond to motion of a key beyond its usual depressed position as a result of the application of additional pressure to the key. Each key may be provided with a resilient bias or deformable end-stop device such as a compression or tension spring or compressible element or block, so that on depression part of the key interacts with the device and is inhibited from further motion by the device unless additional pressure is applied to the key, whereupon the key moves towards its aftertouch position. An aftertouch position may be detectable for each key to provide a polyphonic aftertouch function.

In some implementations of the above described systems a new note-on signal may be issued before a note-off is detected, to facilitate re-triggering, which is useful for piano keyboards. A pressure-control key movement distance (dead-zone) may be provided between a maximum key-pressed position and the start of aftertouch detection, for example to allow the amount of pressure required before aftertouch begins to be configured.

The set of sensors may be provided on a substrate such as a printed circuit board. The sensors may be disposed linearly along the substrate, in particular at locations which correspond to locations of keys of the keyboard, more specifically adjacent where the passive resonant circuits are located on the keys. Coils for the active resonant circuits may be formed by tracks on the substrate, for example defining pancake coils. Although a piano keyboard has black and white keys the sensors may be placed in a single line when the passive resonant circuits are appropriately located. However in some implementations the active and passive resonant circuits are alternate between two positions and are alternately displaced to either side of a longitudinal line defining a general arrangement of the sensors. A set of sensors may comprise sensors for a complete keyboard or for part of the length of a keyboard, for example one, two or more octaves. There is also provided a keyboard for a keyboard instrument comprising one or more the sets of sensors as previously described.

In general a processor/controller of the set of sensors may be any sort of processing device/circuitry, for example comprising one or more of: a microprocessor under program code control, or a digital signal processor (DSP), or hardware such as an FPGA (field programmable gate array) or ASIC (application specific integrated circuit). In some implementations the control/processing functions for a set of sensors may be provided in a single integrated circuit.

Where a programmable device is employed the processor may have associated working memory and non-volatile program memory storing processor control code to control the processor to implement some or all of the functions described above. Thus there is also provided a non-transitory data carrier, such as non-volatile memory, carrying code and/or data to implement functions described above. The code/data may comprise source, object or executable code in a conventional programming language, interpreted or compiled, or assembly code, code/data for setting up or controlling an ASIC or FPGA such as code for a hardware description language such as Verilog (Trade Mark). As the skilled person will appreciate such code and/or data may be distributed between a plurality of coupled components in communication with one another.

There is also provided a method of sensing the positions of a plurality of keys, for example of a keyboard instrument.

The method may comprise providing each key with a sensor comprising a passive resonant circuit for mounting, for example, on a moving part of a key and an active resonant circuit for mounting, for example, in a fixed, reference position, for example part of the keyboard or instrument. In some implementations the passive resonant circuit has a resonant frequency, the active resonant circuit exciting the passive resonant circuit at the resonant frequency. Each sensor may further have a detector, which may be shared, to detect variation of a resonant signal in the active resonant circuit with relative position of the active and passive resonant circuits to detect a position and/or velocity of the key. The method may further comprise arranging the sensors to operate at two or more different resonant frequencies arranged such that keyboard sensors having the same resonant frequency are non-adjacent. Additionally or alternatively the method may further comprise reducing interference between sensors by configuring one or more coils of at least the active resonant circuits, and optionally also of the passive resonant circuits, to have windings in opposite senses.

The method may further comprise providing polyphonic aftertouch by distinguishing between at least three different key positions, a first, note-off position, a second, note-on position, and a third, aftertouch position, wherein the aftertouch position is beyond the note-on position and corresponds to additional pressure applied to the key after depression and movement of a key beyond an end-stop position.

There is further provided a keyboard, in particular a musical keyboard providing an output signal derived from measurements of the position and of the velocity and of the pressure applied to a plurality of moveable keys on the keyboard. The measurements may be derived from position sensors on the moveable keys. Each position sensor may comprise an active tuned resonant circuit; drive electronics coupled to the active tuned resonant circuit to drive the active tuned resonant circuit, optionally shared between sensors; and an electrically reactive element associated with the moveable key. The electrically reactive element may provide a variable modification to a response of the active tuned resonant circuit dependent on a relative position of the electrically reactive element with respect to the active tuned resonant circuit. The keyboard may further comprise read-out electronics coupled to the active tuned resonant circuit, to provide a variable output signal responsive to the relative position of the electrically reactive element with respect to the active tuned resonant circuit. The variable output signal of the read-out electronics may provide the position sensor output.

Preferably, but not essentially, the electrically reactive element comprises a passive tuned resonant circuit tuned to a frequency at which the active tuned resonant circuit is driven, thus the position sensor is operated at a single resonant frequency. Advantages to this approach include: Firstly, a larger effective sensing distance can be achieved for a given size of position sensor. Secondly, a larger variation in the output signal of the position sensor for a given variation in sensed position can be obtained, often removing the requirement of an output amplifier for the position sensor and thus reducing complexity and cost. Thirdly, operation of a plurality of proximally located position sensors is facilitated because the inventors have found that a passive tuned resonant circuit of a first position sensor tuned to the resonant frequency of the first position sensor does not substantially affect the output of a second position sensor if the second position sensor is tuned to a significantly different resonant frequency to that of the first position sensor.

In broad terms an example range of resonant frequencies is 1-10 MHz, balancing speed against the deleterious effect of parasitics. For example a first resonant frequency may be in the range 3-4 MHz and a second resonant frequency may be in the range 4-5 MHz.

A particularly advantageous means of forming coils used by the active tuned resonant circuit and passive tuned resonant circuit has been found to be a flat or planar coil defined by tracks on a printed circuit board. This helps achieve a well-defined repeatable geometry and facilitates other electrically active components being proximally located on the printed circuit board.

To minimise electro-magnetic emissions radiated from the position sensor and to minimise susceptibility to electro-magnetic interference signals of said position sensor, the coils of the active tuned resonant circuit may be formed from a plurality of electrically connected primary "smaller" coils wherein the winding direction of said primary smaller coils is chosen such that the sum of the electro-magnetic far field radiated from said primary smaller coils is substantially zero. In this case the inductance coils used by the passive tuned resonant circuit may: be inductively coupled to only a subset of said primary smaller coils; or be comprised of a plurality of electrically connected secondary smaller coils wherein the winding direction and number of said secondary smaller coils may be chosen to maximise the variation in the output signal of said position sensor.

Although the above described systems and methods are particularly advantageous for use with keyboards their applications are not restricted to keyboards.

BRIEF DESCRIPTION OF THE DRAWINGS

These and other aspects of the invention will now be further described, with reference to the accompanying drawings, in which:

FIG. 3A shows an example printed circuit design, on an enlarged scale, for an active tuned resonant circuit for use with example implementations of the system.

FIG. 3B shows an example printed circuit design, on an enlarged scale, for a passive tuned resonant circuit for use with example implementations of the system.

FIGS. 13A and 13B shows examples of sensor resonant circuits with coils having windings in opposite senses, according to example implementations of the system.

DESCRIPTION OF PREFERRED EMBODIMENTS

Figure 4:
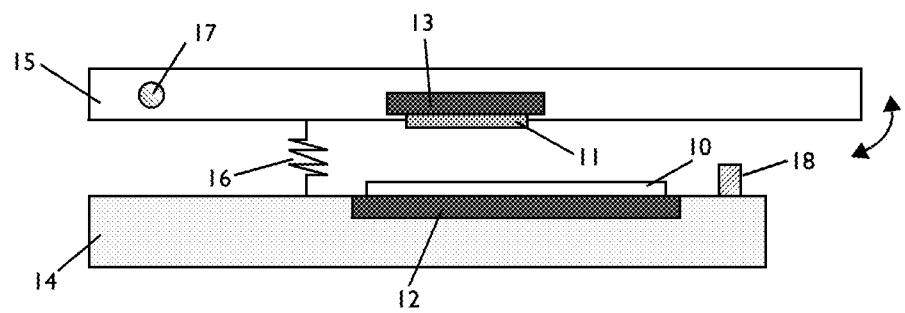
FIG. 4 shows a cross section view of a key of a musical keyboard wherein the position of a key is determined using an example implementation of the system.

A preferred embodiment comprises a musical keyboard with a plurality of moveable keys wherein each moveable key FIG. 4 comprises: a moveable top member 15 that is rotated about a pivot point 17 and which resists movement by means of a spring 16 or other mechanical linkage; a fixed bottom member 14; a deformable end-stop 18 which limits movement of said top member; and a position sensor comprising an active tuned resonant circuit 10 inductively coupled to an electrically reactive element 11, henceforth referred to as the target, providing a signal which varies as the mutual separation of said active tuned resonant circuit and said target is varied, drive electronics connected to said active tuned resonant circuit and read-out electronics connected to said active tuned resonant circuit.

Figure 1:
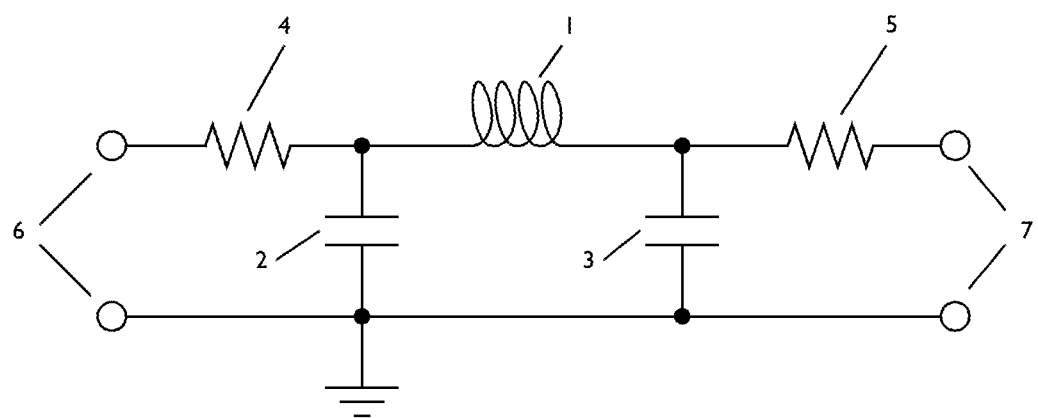
FIG. 1 shows an active tuned resonant circuit for use with example implementations of the system.

The active tuned resonant circuit FIG. 1 comprises an input resistive element 4, a coil 1, two capacitive elements 2 and 3, an output resistive element 5, a means of connecting 6 drive electronics to said input resistive element and a means of connecting 7 read-out electronics to said output resistive element. Said input resistive element may be omitted, but it is preferred because: it limits the current supplied to said active tuned resonant circuit from said drive electronics which reduces the operating current and thus reduces both power consumption and electro-magnetic emissions from said active tuned resonant circuit; and it increases the sensitivity of proximity detection when said read-out electronics are connected to said active tuned resonant circuit. Said output resistive element may be omitted, but it is also preferred because said input and output resistive elements reduce the effect of connecting wires on the impedance of said active tuned resonant circuit thus allowing all the position sensors to be essentially the same regardless of the length of connections to the drive electronics and to the read-out electronics.

Figure 2:
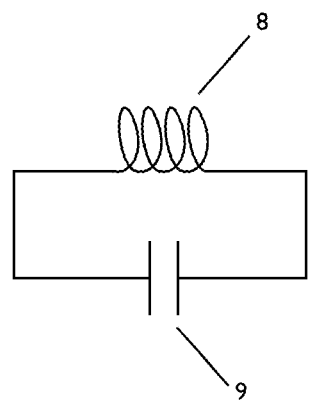
FIG. 2 shows a passive tuned resonant circuit for use with example implementations of the system.

Referring to FIG. 2, the reactive element preferably comprises a passive tuned resonant circuit which comprises a coil 8 and a capacitive element 9 wherein said coil and said capacitive element are connected to form a closed resonant LC circuit. It is not necessary for the size nor for the value of inductance of the coils 1 and 8 to be substantially similar. The value of the capacitance of said capacitive element 9 is preferably chosen to tune the frequency of resonance of said passive tuned resonant circuit to match the frequency of resonance of the active tuned resonant circuit FIG. 1. When said passive and active circuits are thus tuned, it is possible to operate a plurality of position sensors where proximally located said position sensors are tuned to substantially different frequencies of resonance thereby minimising the interaction between said proximally located position sensors. Furthermore when said passive and active circuits are thus tuned the signal amplitude at 7 in FIG. 1 decreases as the distance between said passive and active circuits decreases because more energy is coupled to and dissipated by said passive tuned resonant circuit. Such variation in said signal amplitude is preferred because measuring variations in signal amplitude is faster than measuring variations in frequency of resonance as would be implemented in the case where said active tuned resonant circuit was detuned by proximity to said reactive element.

In the case where the moveable top member 15 of a key comprises an electrically conductive material, and air gap or spacer 13 comprised of a non-conductive material is interposed between said electrically reactive element 11 and said top member. Similarly, in cases there the fixed bottom member 14 comprises an electrically conductive material, and air gap or spacer 12 comprised of a non-conductive material is interposed between the active tuned resonant circuit 10 and said fixed bottom member.

The drive electronics comprise a means of generating an oscillating voltage drive waveform at a frequency equal to or close to the frequency of resonance of the active tuned resonant circuit. Typically, but by way of non-limiting example, this waveform is a square waveform generated by the output of a microcontroller timer or a digital or analogue timing circuit.

Figure 5:
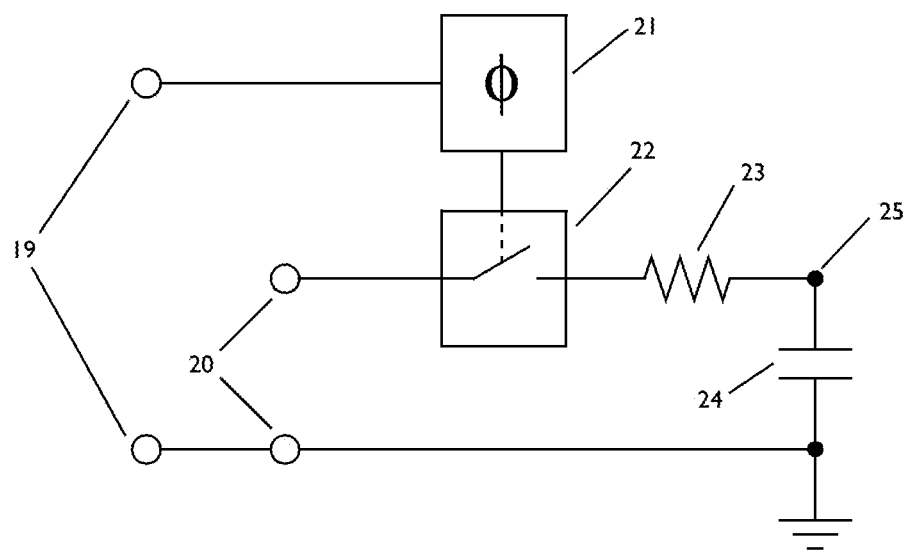
FIG. 5 shows an example of a simple read-out electronic circuit comprising a synchronous demodulator which may be used by example implementations of the system.

The read-out electronics comprise a means of generating a voltage proportional to the amplitude of the signal at the read-out point 7. Typically, but by way of non-limiting example, this comprises a synchronous demodulator circuit FIG. 5 wherein the signal from said read-out point is connected to 20 and demodulated by an analogue switch 22 controlled by the oscillating voltage drive waveform connected to 19 whose phase is optionally adjusted by a phase shifting element 21 and a low-frequency (or dc) voltage is presented at 25 by a low-pass filter comprising a resistive element 23 and a capacitive element 24. Alternative read-out electronic circuits may comprise phase-sensitive rectifiers, phase-insensitive rectifiers, non-synchronous demodulators and peak detectors as understood by those trained in the art.

The coils 1 and 8 used in the active tuned resonant circuit and the passive tuned resonant circuit respectively can be of any type. However using planar spiral coils formed by tracks on a printed circuit board has three main advantages: they are inexpensive, they can be made with highly reproducible values of inductance and the printed circuit board can also be used to mount the other components, namely the capacitive elements 2, 3 and 9, and the resistive elements 4 and 5. It is therefore possible to design a plurality of coils whose inductance values are closely matched.

Referring to FIG. 3A, a typical active tuned resonant circuit may be formed on a printed circuit board comprising a single electrically conductive layer or a plurality of electrically conductive layers whereon: the coil 1 is formed of a continuous spiral track whereby electrical continuity of said track is maintained by electrical connection through connecting vias 53 to a connecting wire or to another spiral track on another conductive layer or to a plurality of spiral tracks on a plurality of conductive layers of said printed circuit board; capacitive elements 2 and 3 and resistive elements 4 and 5 are proximally located; and connection points 6 and 7 are provided for drive electronics and read-out electronics, respectively.

Similarly, referring to FIG. 3B, a typical passive tuned resonant circuit may be formed on a printed circuit board comprising a single electrically conductive layer or a plurality of electrically conductive layers whereon: the coil 8 is formed of a continuous spiral track whereby electrical continuity of said track is maintained by electrical connection through connecting vias 54 to a connecting wire or to another spiral track on another conductive layer or to a plurality of spiral tracks on a plurality of conductive layers of said printed circuit board; and the capacitive element 9 is proximally located.

The inventors have found that the electro-magnetic emissions from an active tuned resonant circuit, and the susceptibility to electro-magnetic interference signals of said active tuned resonant circuit can be substantially reduced when the inductive coil of said active tuned resonant circuit is formed from a plurality of electrically connected primary smaller coils wherein the winding direction of said primary smaller coils is chosen such that the sum of the electro-magnetic far field radiated from said primary smaller coils is substantially zero. A particularly suitable, but by way of non-limiting example, of said inductive coil 1 is shown in FIG. 13A, wherein two primary smaller coils are wired in series with opposing winding directions 58 to form a figure-of-eight coil. In such an arrangement the electro-magnetic far field radiated from the first half of said figure-of-eight coil 56 is equal in magnitude but with opposite polarity to the electro-magnetic far field radiated from the second half of said figure-of-eight coil 57, thus said electro-magnetic far field radiated from said figure-of-eight coil is substantially zero.

In such an arrangement, a passive tuned resonant circuit as shown in FIG. 3B may be ineffective unless the inductive coil of said passive tuned resonant circuit is primarily inductively coupled to only one half 56 or 57 of the figure-of-eight coil of the active tuned resonant circuit. To maximise the output signal of the position sensor, it is preferable for said inductive coil of said passive tuned resonant circuit to be similarly formed of a figure-of-eight inductive coil, as shown in FIG. 13B, comprising two secondary smaller coils wired in series with opposing winding directions 58 wherein each said secondary smaller coil is primarily inductively coupled to a different primary smaller coil of said figure-of-eight coil of said active tuned resonant circuit.

Figure 6:
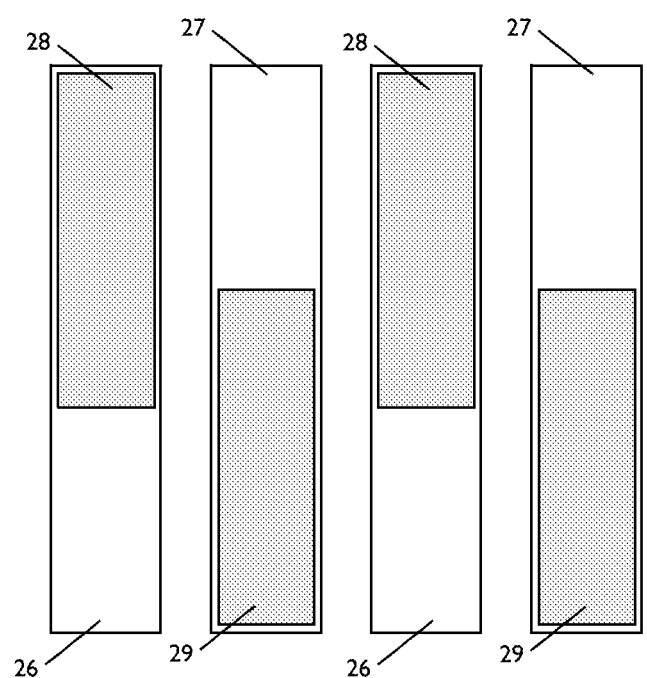
FIG. 6 shows the relative positioning of a series of active tuned resonant circuits and a series of corresponding passive tuned resonant circuits positioned to minimise interference between adjacent tuned resonant circuits according to example implementations of the system.

The inventors have found that although a first passive tuned resonant circuit tuned to a first frequency of resonance of a first active tuned resonant circuit does not substantially affect the output of an adjacent second active tuned resonant circuit tuned to a substantially different second frequency of resonance, when a corresponding second passive tuned resonant circuit tuned to said second frequency of resonance is proximally located, movement of said first passive tuned resonant circuit may affect the output of said second active tuned resonant circuit due to mutual coupling between said first and second passive tuned resonant circuits. Such undesirable interaction can be minimised by offsetting the positions of physically adjacent passive tuned resonant circuits, as shown in FIG. 6 wherein: active tuned resonant circuits 26 and passive tuned resonant circuits 28 are tuned to a first frequency of resonance and active tuned resonant circuits 27 and passive tuned resonant circuits 29 are tuned to a second frequency of resonance.

In a further preferred embodiment the position sensors on the moveable keys of the musical keyboard are controlled by a time-division multiplexing scheme whereby a subset of position sensors are enabled at any given time. For a typical musical keyboard with a large number of keys such as 16 or more, such a scheme has the advantage of reducing cost, complexity, power consumption and electro-magnetic emissions.

In the case where a first position sensor operating at first frequency of resonance and a second position sensor operating at a substantially different second frequency of resonance are proximally located said position sensors can interact in such a way that the output of said first position sensor and the output of said second position sensor contains interference components which vary with a frequency of variation equal to the frequency difference of said first frequency of resonance and said second frequency of resonance. Synchronous demodulation of the output of said position sensors substantially removes said interference components when the cut-off frequency of the reconstruction low-pass filter is substantially lower than said frequency difference. However, the time response of said low-pass filter can limit the speed of response of said position sensors which is undesirable. Therefore, a mechanism to minimise this interference is desired. Using a time-division multiplexing scheme where physically adjacent sensors are not driven at the same time avoids this problem.

In practice it has been found that synchronous demodulation is not necessary for good performance.

Figure 7:
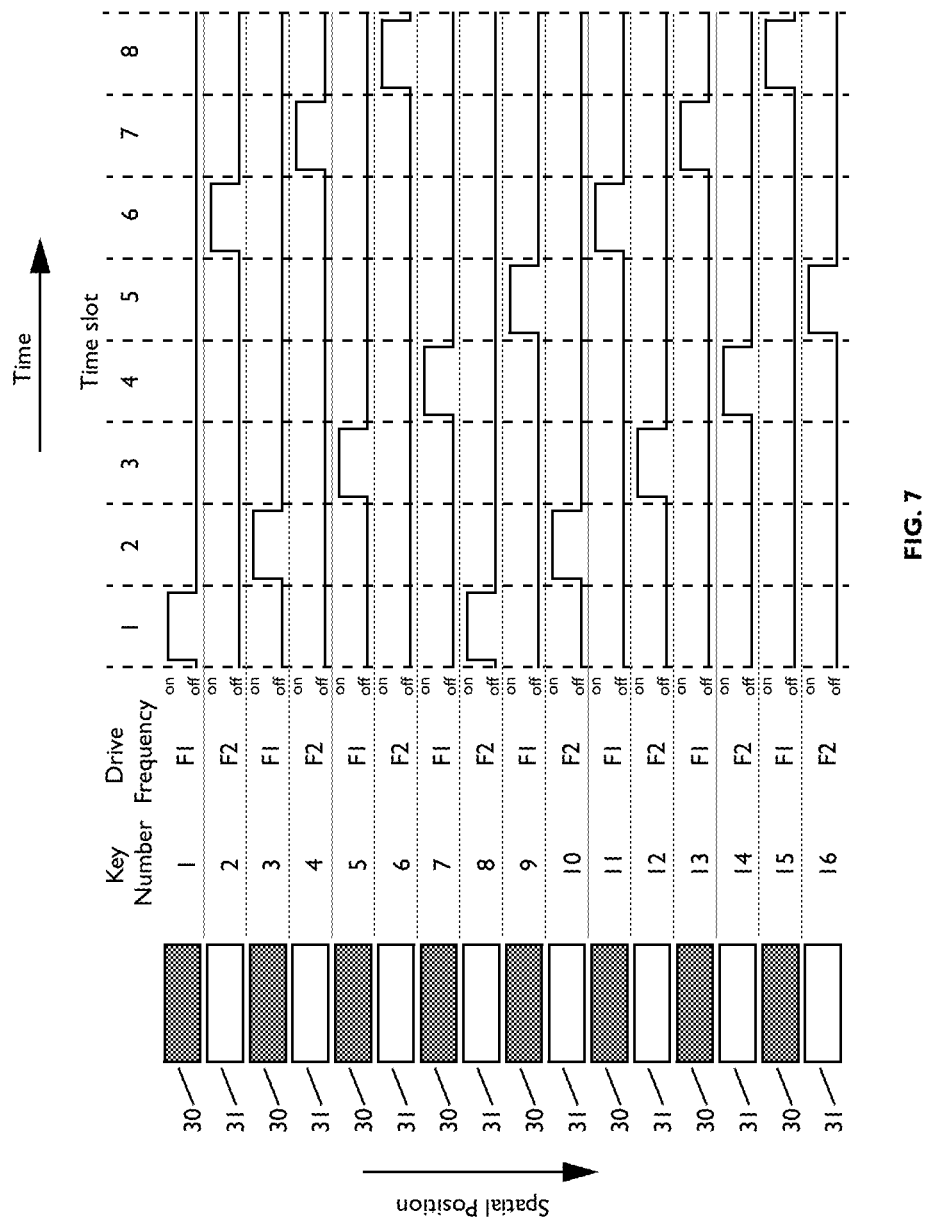
FIG. 7 shows a timing diagram of a time division multiplex circuit used to multiplex a plurality of active tuned resonant circuits to determine the position of a plurality of keys on a musical keyboard according to an example implementation of the system.

Referring to FIG. 7, one illustrative example of such a mechanism is shown as a timing diagram for a subset of position sensors wherein position sensors 30 operating at a first frequency of resonance F1 are adjacent to position sensors 31 operating at a second frequency of resonance F2. In each time slot only one position sensor operating at a first frequency of resonance is enabled and only one position sensor operating at a second frequency of resonance is enabled. Furthermore, physically adjacent position sensors are never enabled at the same time, minimising said interference components. A plurality of said subsets of position sensors can be operated simultaneously.

In broad terms, in the multiplexing of FIG. 7 the keys illustrated shaded black and the keys illustrated shaded white each form a group of keys. The sensors in one group of keys may have a different resonant frequency to the sensors in another group of keys. With a group, say of the black keys, there are 8 time slots and every 8th key is activated (driven) simultaneously. The skilled person will understand that this approach could be adapted for k time slots, driving every kth key simultaneously (that is simultaneously driven keys have k−1 inactive keys between them). Keys in simultaneously active groups, e.g. black and white keys, may be (physically) separated as far as possible.

Some implementations of the system do not employ different groups of keys with different resonant frequencies. Instead all the sensors may have substantially the same resonant frequency. Use of such an approach is facilitated by the coil design described later with reference to FIG. 13. Thus there may be k time slots and every kth key may be active (driven) simultaneously—that is simultaneously driven keys may have k−1 inactive keys between them.

Figure 8:
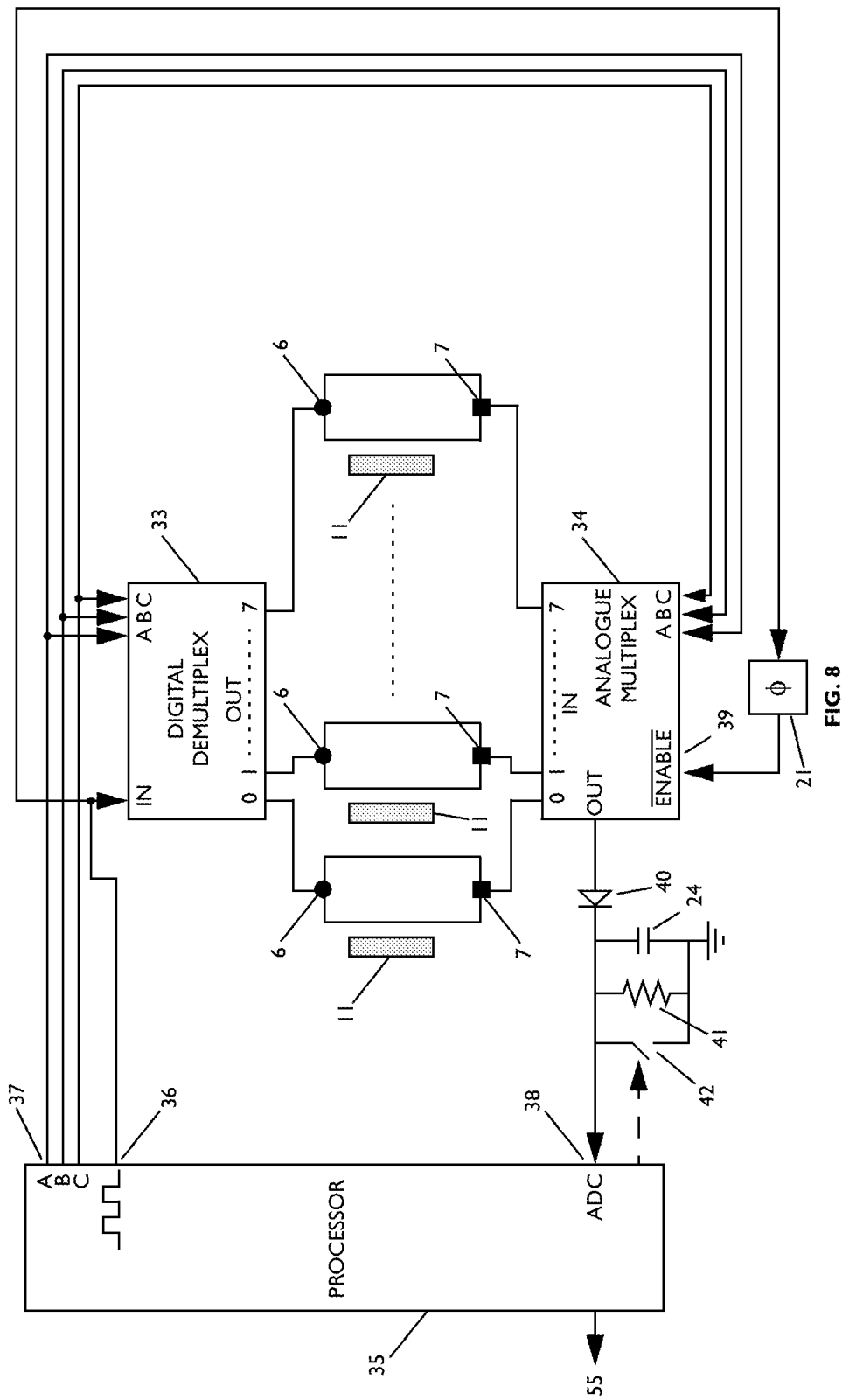
FIG. 8 shows a time division multiplex circuit diagram of a preferred embodiment used to multiplex a plurality of active tuned resonant circuits to determine the position of a plurality of keys on a musical keyboard according to example implementations of the system.

An example time-division multiplexed scheme is shown for a subset of position sensors operating at a single frequency of resonance in FIG. 8. In the system of FIG. 8 a processor 35 generates a drive waveform 36 whose frequency matches the frequency of resonance of said position sensors' active tuned resonant circuits; said processor generates selector signals 37 to select which position sensor is to be enabled; said position sensors' outputs 7 are coupled to an analogue multiplexer 34; said analogue multiplexer's output is coupled to an analogue-to-digital converter within said processor via a low-pass filter comprising a capacitive element 24 and resistive element within said analogue multiplexer; and an output 55 from said processor is used to send information regarding the position and velocity of said position sensors. A further advantage to using said analogue multiplexer to couple said position sensors' outputs to said analogue-to-digital converter is that said analogue multiplexer can perform the function of the analogue switch 22 used for synchronous demodulation whereby the output of said analogue multiplexer can be synchronously enabled and disabled via an enable input 39 coupled to said drive waveform 36. In the case where a plurality of position sensors are operated at substantially different frequencies of resonance said time-division multiplexed scheme can be replicated as necessary. A suitable processor is an ARM Cortex-MO.

FIG. 8 shows just one demultiplexer/multiplexer but if there are multiple resonant frequencies one demultiplexer/multiplexer may be employed for each of the resonant frequencies used. For example a second demultiplexer/multiplexer may be used where alternate resonant frequencies are mapped to alternate keys of the keyboard.

Decreased sensitivity to detuning of the position sensor's active tuned resonant circuit or passive tuned resonant circuit, for example, caused by variations of component tolerance, may be facilitated by coupling the output of the (optional) synchronous demodulator circuit to a peak detection circuit comprising a diode 40 a capacitive element 24 and optionally a resistive element 41 or a switching element 42 (to reset the charge on capacitive element 24). In the case where a switching element is used said switching element may reset the detected peak level synchronously with the selector signals used to control the multiplexers.

The signal from the detector (read-out circuitry) may be input to an analogue-to-digital converter 38, for example integrated into an analogue input of processor 35.

In the case where a disabled position sensor's active tuned resonant circuit is not being driven, said active tuned resonant circuit acts as a tuned antenna. This has the negative effect whereby moving the target corresponding to said disabled position sensor can effect a measurable variation in the output of a similarly-tuned position sensor even if said similarly-tuned position sensor is not physically adjacent to said disabled position sensor and the motion of said target is constrained to be within its normal limits above said disabled position sensor, according to FIG. 4 and FIG. 6. Said negative effect can be reduced by changing the frequency of resonance of said disabled position sensor's active tuned resonant circuit for the duration of the disablement, for example by changing the capacitance, resistance or inductance of said active tuned resonant circuit by electronic switching. Most simply this can be done by driving said disabled sensor with a direct-current, or low-frequency signal, to prevent resonance. Referring to FIG. 8, a particularly advantageous way to achieve this in a time-division multiplexed scheme is to use a digital demultiplexer 33 to drive the inputs 6 of the active tuned resonant circuits whereby enabled position sensors' active tuned resonant circuits are driven by a waveform 36 at the frequency of resonance of said active tuned resonant circuits and disabled position sensors' active tuned resonant circuits are driven by a direct-current signal corresponding to logic-high or logic-low of said digital demultiplexer.

It is important for the performance of a musical keyboard to be stable over a range of operating temperatures. Although the tuned resonant circuits used by a position sensor as described herein have excellent temperature stability, particularly when the tuned resonant circuits are formed on a printed circuit board and the capacitive elements of the tuned resonant circuits comprise temperature-stable dielectrics (Class 1 dielectrics), other electronic elements in the circuit can have properties that change with temperature which may cause a variation in the output signal of the position sensor with variations in operating temperature. Such electronic elements include but are not limited to: diode 40, digital demultiplexer 33, analogue multiplexer 34, resistive elements 4, 5 and 41, tracks on printed circuit boards, and voltage regulators. Therefore a temperature compensation scheme can be useful to minimise variations in the output signals of a plurality of position sensors on a musical keyboard caused by variations in operating temperature.

A particularly suitable, but by way of non-limiting example, temperature compensation scheme comprises: performing measurements of the output signal of a position sensor while driving said position sensor's active tuned resonant circuit with a direct-current, or low-frequency signal such that said position sensor's passive tuned resonant circuit has no effect on the output signal of said position sensor; the first of said measurements is performed during a calibration procedure; the subsequent said measurements may be performed periodically, for example within additional time slots of a time-division multiplexed scheme; calculating temperature-dependent offsets in said output signal by subtracting subsequent said measurements from said first measurement; and adding said offsets to the measurement of said output signal when said active tuned resonant circuit is being driven at a frequency equal to or close to the frequency of resonance of said active tuned resonant circuit to measure position. Such a temperature compensation scheme may utilise one temperature-dependent offset for: each position sensor in a musical keyboard; each group of position sensors in a musical keyboard; or for all position sensors in a musical keyboard.

A musical keyboard with moveable keys utilising a multiplexing scheme as hereinabove described allows fast and accurate measurement of the position of said keys. For example it is possible to multiplex the example shown in FIG. 8 wherein the frequency of update of selector signals 37 is at least 32,000 Hz thus allowing the position of each moveable key in a subset of 8 moveable keys to be determined at a frequency of 4,000 Hz. This example can be replicated and run in parallel for other subsets of moveable keys, thus allowing a full-size piano keyboard with 88 keys to have the position of the keys determined at a rate of at least 352,000 keys/second. The inventors hereof have found that positions of said keys should ideally be determined at least 250 times per second, corresponding to a rate of at least 22,000 keys/second for 88 keys, to allow suitably accurate timing of note-on events and note-off events and to determine the key velocity associated with said events. Clearly implementations of the described system easily exceed these targets.

Figure 9:
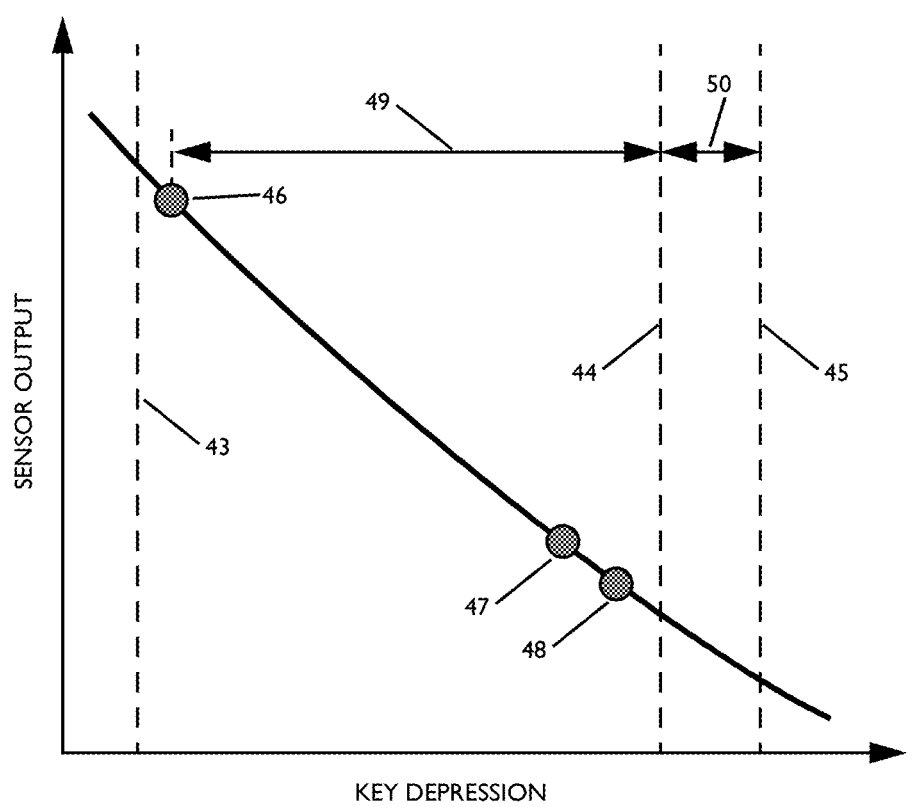
FIG. 9 shows the sensor output versus key displacement of a key on a musical keyboard according to example implementations of the system.
Figure 11:
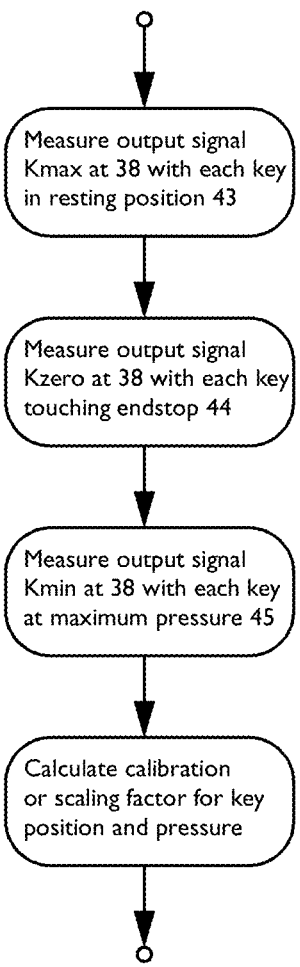
FIG. 11 shows an example calibration procedure used to calibrate the detected position of a key on a musical keyboard according to example implementations of the system.

Referring to FIG. 9, when a moveable key on a musical keyboard according to example implementations of the system is depressed there are three primary positions of said key: the resting position Kmax 43 when said key is at rest; the point Kzero 44 when the moveable top member 13 makes a first contact with the deformable end-stop 18; and the point of maximum depression Kmin 45, corresponding to the point of maximum pressure being applied to said key by a typical musician wherein the deformable end-stop 18 may be considered to be maximally deformed. For a plurality of such moveable keys, due to mechanical variation and due to electronic component tolerance, it is unlikely that the output signal of the position sensor of a first key at any one of said primary positions of said first key will be identical to the output signal of the position sensor of a second key at the same primary position of said second key. Therefore a calibration procedure is necessary to ensure that the position of any moveable keys is known relative to the respective primary positions of said moveable keys. Such a calibration procedure is shown in FIG. 11.

In the case where the position of a moveable key is between primary positions Kmax and Kzero, the calibrated position K of said key as a percentage of depression between Kmax and Kzero can thus be calculated from the measured position Ko of said key using the following equation: K=100%×(Ko−Kzero)/(Kmax−Kzero).

In the case where the position of a moveable key is between primary positions Kzero and Kmin, the calibrated position Kpress of said key as a percentage of depression between Kzero and Kmin, 50 in FIG. 9, can thus be calculated from the measured position of said key Ko using the following equation: Kpress=100%×(Ko−Kmin)/(Kzero−Kmin) In such a case Kpress may be considered to be the amount of pressure being applied to said key, corresponding to the range of depression 50 of said key.

In some embodiments the calculation of Kpress may include an offset, Kpoff, whereby Kpress is zero until the position of the key Ko lies between (Kzero−Kpoff) and Kmin; thence Kpress=100%×(Ko−Kmin)/(Kzero−Kpoff−Kmin) Said offset creates a dead-zone wherein variation in position of said key results in no variation of calibrated position K of said key and in no variation of Kpress. This facilitates implementation of an aftertouch threshold.

On a typical musical keyboard it is desirable for each moveable key on said keyboard to issue a note-on event when the depression of said key is beyond a secondary position Kon and to issue a note-off event when the depression of said key is returned to another secondary position Koff. In some cases Kon may equal Koff, but it is preferred for Kon and Koff to be unequal. Referring to FIG. 9, preferably secondary position Kon 48 is chosen to be near the primary position Kzero 44. Similarly, the secondary position Koff 47 is chosen to be near the said secondary position Kon.

In some embodiments it is possible after issuing a first note-on event to issue a second note-on event, and optionally issue a note-off event preceding said second note-on event, when the depression of said moveable key has returned to a position before secondary position Kon but has not returned to secondary position Koff and then the depression of a moveable key varies to a position beyond secondary position Kon. This facilitates re-triggering.

In some embodiments the secondary position Koff 46 of each moveable key is chosen to be near the primary position Kmax 43. Such an arrangement allows the position of said key to be used to issue expression events prior to issuing a note-off event wherein the measured position Ko of said key between Koff and Kzero can be used to calculate a calibrated expression value Kexp=100%×(Ko−Kzero)/(Koff−Kzero), corresponding to the range of depression 49 of said key.

Figure 12:
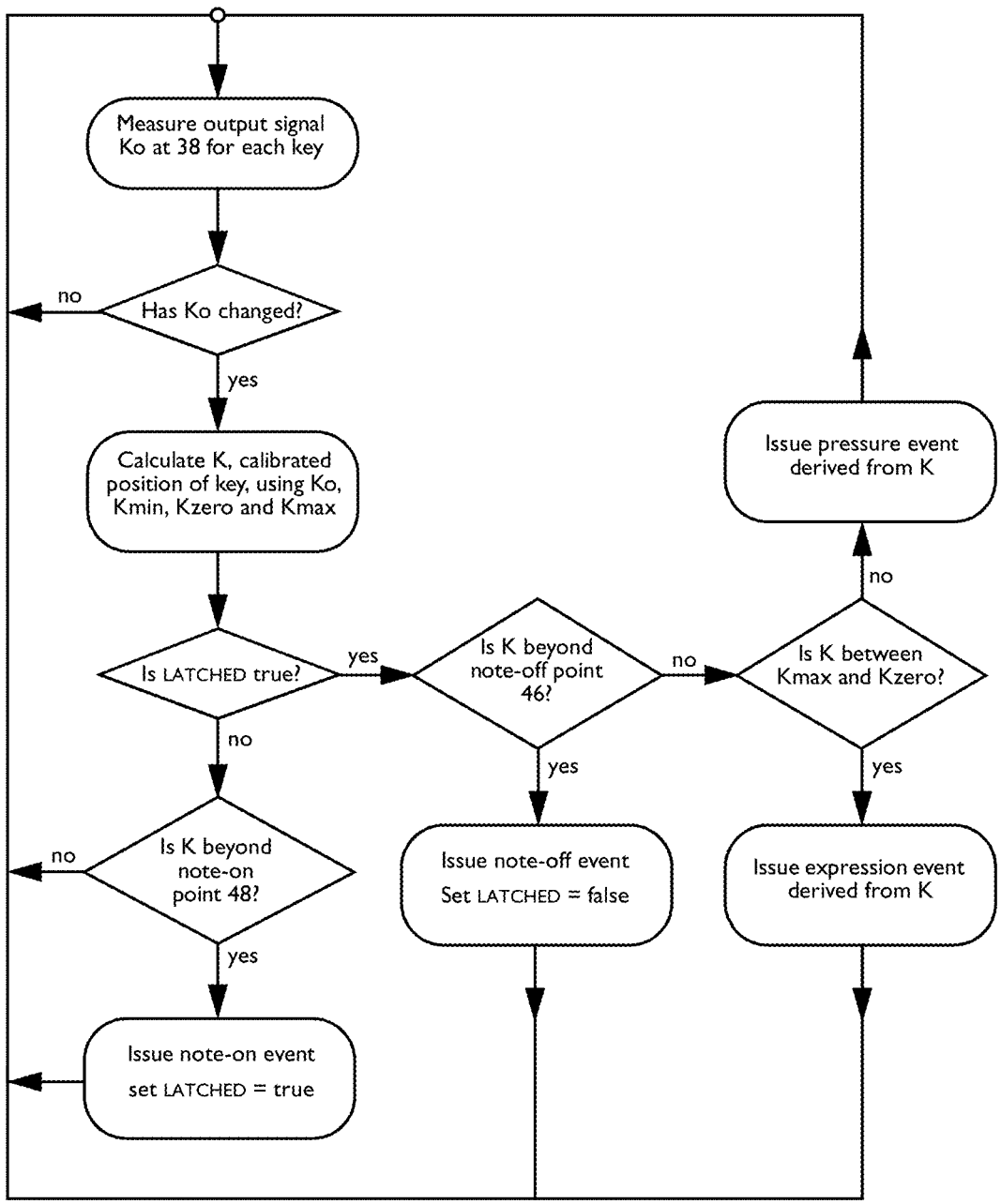
FIG. 12 shows an example algorithm used to detect note-on events, note-off events, expression events, and pressure events for a key on a musical keyboard according to example implementations of the system.

By way of non-limiting example, one particular algorithm shown in FIG. 12 may be used for each moveable key on a musical keyboard according to an example implementation of the system wherein the measured position Ko of said moveable key, when calibrated using primary positions Kmax, Kzero and Kmin and thence using secondary positions Kon and Koff, may be used to issue: note-on events, note-off events, expression events and pressure events for each moveable key on said musical keyboard.

A particular advantage of deriving the secondary positions Kon and Koff of a moveable key on a musical keyboard from the primary positions Kmax and Kzero of said moveable key is that said secondary positions can be modified easily by simple numerical calculations, allowing the response of said musical keyboard to be changed. Moreover such modification can be different for each individual key on a musical keyboard with a plurality of moveable keys, allowing a large range of responses to be achieved on said musical keyboard without requiring any mechanical changes to the musical keyboard.

To provide further expressive control of a musical sound production system it is common for a musical keyboard to send velocity information relating to note-on events and also possibly related to note-off events. Such velocity information can be determined by measuring the separation in time between two known points of key depression, or conversely measuring the change in said key depression at two known points in time.

In embodiments the velocity (speed and direction) of a moveable key is determined from a plurality of positions of said key at a plurality of corresponding times using averaging, filtering, or similar methods. An example is described in detail below. Such a method of calculating said velocity has several advantages over other methods: it does not assume a linear velocity profile as is used for a two-point measurement method but allows changes in velocity throughout the range of depression of said key to be detected thus measured values of velocity are more representative of the true velocity of said key thus making the response of said key more consistent; higher resolution and precision of velocity can be determined because a larger number of statistically significant data points are used; and it allows predictions of the future position of said key to be calculated allowing, for example, the future time at which said key's position equals secondary positions Kon and Koff to be estimated, thus permitting note-on or note-off events to be issued in advance of the corresponding physical event thus compensating for latency in a musical sound production system.

One example filtering procedure is as follows:

$$\text{delta}V = \text{deltaPos} \text{ (i.e. the change in position between fixed time steps)}$$

$$\text{alpha} = k * \text{abs}(\text{delta}V)$$

The filtering coefficient, alpha, depends on magnitude of deltaV; alpha is limited to sensible values to avoid overflow/underflow.

$$\text{velocity} = \text{alpha} * \text{delta}V + (1 - \text{alpha}) * \text{last\_velocity}$$

Such a method, which may be implemented in the digital domain, can provide improved resolution because of the filtering, which is especially important for a very slowly moving key, without significantly compromising the time response for a fast-moving key. Modifying the filtering and/or a maximum permitted velocity value can modify the feel of an instrument, for example to give it a harder or softer response.

Figure 10:
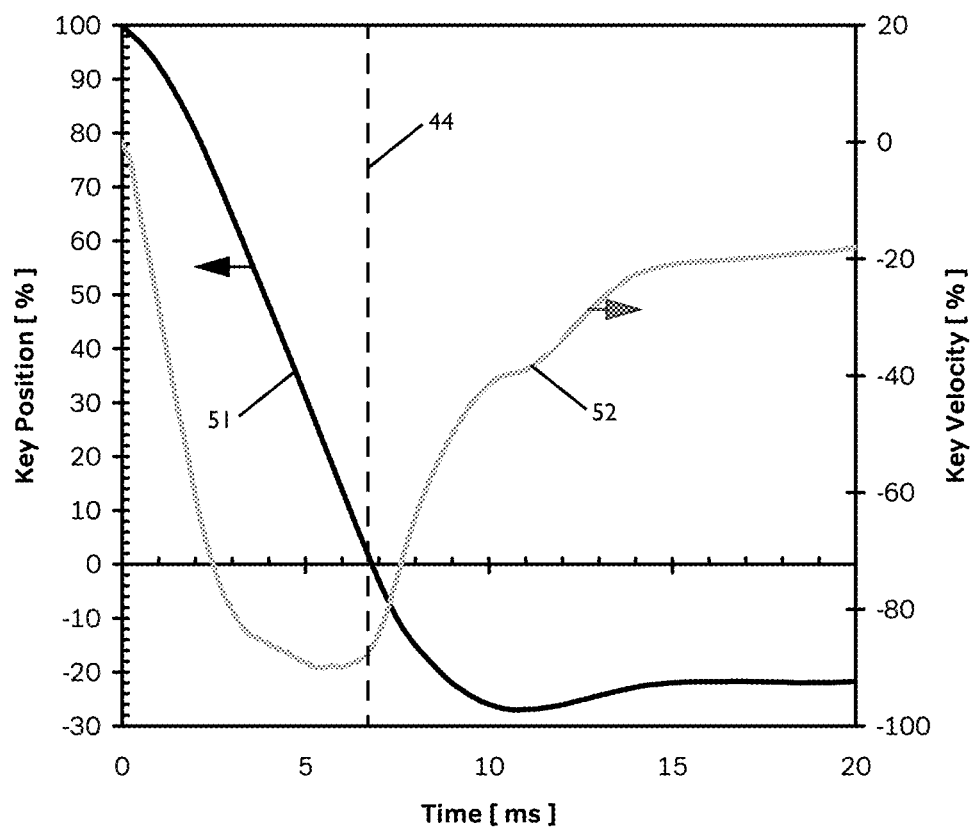
FIG. 10 shows an example of the measured position and measured velocity of a key on a musical keyboard as it is depressed according to example implementations of the system.

To illustrate such benefits of such a method, FIG. 10 shows the calibrated position 51 of a moveable key and the corresponding calibrated velocity 52 of said key wherein the depression of said key reaches primary point Kzero 44 within 7 ms of the start of depression of said key. The plot of FIG. 10 approximates a velocity calculated directly from differentiated position but when the position moves slowly the velocity filtering is heavier so the velocity lags a little. Such a method can yield substantially more information regarding the velocity of a moveable key on a musical keyboard than other methods.

Movement detection systems for musical keyboards have been described as well as sensing systems and methods for keyboard instruments. However the techniques described are not limited to musical keyboards and may also be used, for example for computer keyboards.

For example in some implementations the above described techniques may be employed in a laptop keyboard. In this case one or both of the passive and active resonant circuits may be mounted on a flexible PCB. For example the passive resonant circuits may be mounted beneath the keys, on a flexible PCB and the active resonant circuits may be mounted on an underlying rigid PCB. The ability to sense position may be used to sense pressure applied to a key, for example if some resilient material is provided between the active and passive resonant circuits. In some implementations, for example a laptop, computer, or other keyboard, where the keys are arranged in a 2D pattern on a flat or curved surface, the multiplexing may be arranged, for example in a generally corresponding manner to that described above, so that no key is driven at the same time as an adjacent key in two dimensions. For example in a rectangular 2D grid alternate keys in each of two dimensions in a surface defined by the keyboard may be active in alternate time slots (i.e. two sets of non-adjacent keys may be identified); this may be extended to key layouts defined by hexagonal and other grids where sets of non-adjacent keys may similarly be identified. Keys which are adjacent to one another in a surface defined by the keyboard may be inactive and/or damped when a target key is read. However, as previously described, the multiplexing may be arranged to read multiple keys of the keyboard simultaneously. The described techniques can be advantageous for computer and other keyboards because they can be fabricated inexpensively and because response times can be very quick, for example <1 ms.

In another implementation, the above described techniques may be employed to sense pressure, a sensor further comprising a deformable element, for example a block or layer of rubber, below and/or between of one or both of the passive resonant circuit and the active resonant circuit. Such an arrangement may be employed, for example, as a sensor for an electronic drum pad.

Further aspects of the invention are defined in the following clauses C1-C25:

C1. A sensing system for a keyboard, the sensing system comprising:
a plurality of key sensors, wherein each key sensor comprises:
a passive resonant circuit, and an active resonant circuit, the passive resonant circuit having a resonant frequency, the active resonant circuit being configured to excite the passive resonant circuit at the resonant frequency;
the sensing system further comprising:
at least one sensor driver to drive the active resonant circuits with an RF drive signal at the resonant frequency;
a multiplexing system to multiplex the drive signal such that simultaneously driven key sensors are separated by at least (k−1) keys, where (k−1) is an integer equal to or greater than 1; and
at least one detector to detect a level of RF signal from a driven key sensor for sensing a position and/or velocity of a key associated with the key sensor.

C2. A sensing system as in C1 configured to damp the active resonant circuits of key sensors which are not driven.

C3. A sensing system as in C1 or C2 wherein at least the active resonant circuit comprises one or more coils with windings in opposite senses, in particular wherein the windings in opposite senses are configured to generate magnetic fields in opposite senses to cancel one another.

C4. A sensing system as in C1, C2 or C3 wherein the active resonant circuit comprises a pair of laterally adjacent pancake coils.

C5. A sensing system as in any one of C1 to C4 further comprising a temperature-compensation system to temperature-compensate the detected level of RF signal, wherein the temperature-compensation system is configured to apply an off-resonance drive signal to at least one of the active resonant circuits, to measure a level of the off-resonance drive signal from the at least one detector, and to compensate the detected level of RF signal responsive to the level of the off-resonance drive signal.

C6. A sensing system as in C5 wherein the multiplexing system is configured to multiplex the drive signal such that one of the key sensors is driven in each of a set of time slots, and wherein the temperature-compensation system is configured to apply the off-resonance drive signal during an additional time slot to the set of time slots.

C7. A sensing system as in any one of C1 to C6 wherein each key sensor further comprises a deformable element to limit motion of one or both of the passive resonant circuit and the active resonant circuit for pressure sensing.

C8. A sensing system comprising a set of sensors for the keyboard of a keyboard instrument,
wherein the keyboard has a plurality of keys;
wherein each sensor comprises a passive resonant circuit for mounting on a moving part of a key and an active resonant circuit for mounting in a reference position, the passive resonant circuit having a resonant frequency, the active resonant circuit exciting the passive resonant circuit at the resonant frequency, each sensor further having a detector to detect variation of a resonant signal in the active resonant circuit with relative position of the active and passive resonant circuits to detect a position and/or velocity of the key; and
wherein the set of sensors comprises sensors having two or more different resonant frequencies arranged such that sensors having the same resonant frequency are non-adjacent.

C9. A sensing system as in C8 wherein sensors having a first resonant frequency are interleaved with sensors having a second, different resonant frequency.

C10. A sensing system as in C8 or C9 further comprising a multiplexing system and/or controller to control selection of sensors of the set of sensors such that adjacent keyboard sensors are selected at different times.

C11. A sensing system as in any one of C1-7 and C10 wherein the multiplexing system/controller is further configured to damp the active resonant circuits of unselected sensors.

C12. A sensing system as in C10 or C11 wherein the multiplexing system/controller is configured to time division multiplex operation of the sensors, wherein each resonant frequency defines a group of sensors having the resonant frequency, wherein the time division multiplexing defines a plurality of n time slots, and wherein successive keyboard sensors of each group are allocated successive time slots.

C13. A sensing system as in C12 wherein there are N resonant frequencies and N groups of sensors, wherein sensors of the groups of sensors are interleaved on the keyboard.

C14. A sensing system as in C13 wherein the multiplexing system/controller is configured such that keyboard sensors in the same group and activated in the same time slot have (n×N)−1 sensors between them.

C15. A sensing system as in any preceding clause further comprising a processor configured to process the variation of the resonant signal in the active resonant circuit of each sensor to determine the motion of each key of the keyboard over a succession of time intervals as a depressed key moves between released and depressed positions, in particular wherein the motion of each key comprises a position and a velocity of the key as the key moves between released and depressed positions.

C16. A sensing system as in C15 wherein the processor is configured to process the variation of the resonant signal in the active resonant circuit of each sensor to determine the velocity of a key, as the key moves between depressed and released positions, from changes in position of the key determined at successive time intervals filtered dependent upon key velocity.

C17. A sensing system as in any preceding clause further comprising a processor coupled to process the level/variation of the RF/resonant signal to determine a key press and key release event for each key.

C18. A sensing system as in any one of C15-C17 wherein the processor is further configured to distinguish between at least three different key positions, a first, note-off position, a second, note-on position, and a third, aftertouch position, wherein the aftertouch position is beyond the note-on position and corresponds to additional pressure applied to the key after depression.

C19. A sensing system as in any preceding clause further comprising a substrate supporting the active resonant circuits for the sensors in a sequence corresponding to a sequence of keys of the keyboard.

C20. A keyboard, in particular for a keyboard instrument, comprising the sensing system of any preceding claim.

C21. A polyphonic aftertouch keyboard comprising the sensing system or keyboard of C19 or 20, each key having a deformable end-stop, such that the after-touch position corresponds to movement of a key beyond an end-stop position defined by the deformable end-stop, wherein identification of the aftertouch position for the key enables polyphonic aftertouch.

C22. A method of sensing the positions of a plurality of keys, in particular of a keyboard instrument, the method comprising:
providing each key with a sensor comprising a passive resonant circuit for mounting on a moving part of a key and an active resonant circuit for mounting in a reference position, the passive resonant circuit having a resonant frequency, the active resonant circuit exciting the passive resonant circuit at the resonant frequency, each sensor further having a detector to detect variation of a resonant signal in the active resonant circuit with relative position of the active and passive resonant circuits to detect a position and/or velocity of the key; and
arranging the sensors to operate at two or more different resonant frequencies arranged such that keyboard sensors having the same resonant frequency are non-adjacent; and/or
reducing interference between sensors by configuring one or more coils of at least the active resonant circuits to have windings in opposite senses.

C23. A method as in C22 further comprising providing polyphonic aftertouch by distinguishing between at least three different key positions, a first, note-off position, a second, note-on position, and a third, aftertouch position, wherein the aftertouch position is beyond the note-on position and corresponds to additional pressure applied to the key after depression and movement of a key beyond an end-stop position.

C24. A method of periodically compensating a response of a keyboard, the keyboard comprising keys with each with a sensor comprising an active resonant circuit, a passive tuned resonant circuit and a detector, the method comprising:
retrieving from storage a detected initial output signal of the sensor, $O_{r0}$, at a first time, $t_o$, wherein at to said active resonant circuit is being driven at a frequency below a resonant frequency of said active resonant circuit; and periodically, for at least one of the sensors:
detecting a later output signal of the sensor, $O_{r1}$, at a time after to;
calculating an adjustment value, wherein the adjustment value is a difference between the initial output signal of the sensor and the later output signal of the sensor; and
compensating the response of the keyboard by adjusting an operational output of the sensor using the adjustment value, where the operational output is an output from the sensor when the active resonant circuit is being driven at the resonant frequency of the active resonant circuit.

C25. The method of C24 further comprising operating the sensor according to a time division multiplexed addressing scheme, and using a time slot of the time division multiplexed addressing scheme in which the sensor is not operational for the detecting.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A sensing system comprising a set of sensors for the keyboard of a keyboard instrument,
wherein the keyboard has a plurality of keys;
wherein each sensor comprises a passive resonant circuit for mounting on a moving part of a key and an active resonant circuit for mounting in a reference position, the passive resonant circuit having a resonant frequency, the active resonant circuit exciting the passive resonant circuit at the resonant frequency, each sensor further having a detector to detect a variation of a resonant signal in the active resonant circuit with a relative position of the active and passive resonant circuits to detect a position and/or velocity of the key; and
wherein one or more coils of the active resonant circuit comprise two coils with opposing winding directions connected in series such that the one or more coils of at least the active resonant circuits have windings in opposite senses to thereby reduce interference between sensors of adjacent keys.

2. The sensing system as claimed in claim 1, wherein the system further comprises a processor configured to distinguish between at least three different key positions, a first, note-off position, a second, note-on position, and a third, aftertouch position, wherein the aftertouch position is beyond the note-on position and corresponds to additional pressure applied to the key after depression and movement of a key beyond an end-stop position.

3. The sensing system as claimed in claim 1, wherein:
one or more of the active resonant circuits comprise more than one coil; and
the more than one coils are positioned next to one another along the longitudinal direction defined by the key, wherein the positioned coils define a major length along the longitudinal direction and define a minor length perpendicular to the longitudinal direction.

4. The sensing system as claimed in claim 1, wherein one or more coils of the passive resonant circuit have windings in opposite senses.

5. The sensing system as claimed in claim 4, wherein the one or more coils of the passive resonant circuit comprise two secondary coils wired in series with opposing winding directions.

6. The sensing system as claimed in claim 5, wherein the secondary coils of the passive resonant circuit are primarily inductively coupled to different coils of the active tuned resonant circuit respectively.

7. The sensing system as claimed in claim 1, wherein active resonant circuits of adjacent keys are offset relative to an axis defined by the arrangement of the plurality of keys.

8. The sensing system as claimed in claim 7, wherein an active resonant circuit of a first key of the plurality of keys and an active resonant circuit of a second key of the plurality of keys to be on either side of said axis are offset on either side of said axis.

9. A method of sensing the position and/or velocity of a plurality of keys, in particular of a keyboard instrument, the method comprising:
providing each key with a sensor comprising a passive resonant circuit for mounting on a moving part of a key and an active resonant circuit for mounting in a reference position, the passive resonant circuit having a resonant frequency, the active resonant circuit exciting the passive resonant circuit at the resonant frequency, each sensor further having a detector to detect a variation of a resonant signal in the active resonant circuit with a relative position of the active and passive resonant circuits to detect a position and/or velocity of the key; and
reducing interference between sensors of adjacent keys by configuring one or more coils of the active resonant circuit to comprise two coils with opposing winding directions connected in series such that the one or more coils of at least the active resonant circuits have windings in opposite senses.

10. The method as claimed in claim 9, further comprising providing polyphonic aftertouch by distinguishing between at least three different key positions, a first, note-off position, a second, note-on position, and a third, aftertouch position, wherein the aftertouch position is beyond the note-on position and corresponds to additional pressure applied to the key after depression and movement of a key beyond an end-stop position.

11. The method as claimed in claim 9, wherein:
one or more of the active resonant circuits comprise more than one coil; and
configuring the more than one coil comprises positioning each of the coils next to one another along the longitudinal direction defined by the key, wherein the positioned coils define a major length along the longitudinal direction and define a minor length perpendicular to the longitudinal direction.

12. The method as claimed in claim 9, further comprising configuring one or more coils of the passive resonant circuit to have windings in opposite senses.

13. The method as claimed in claim 9, further comprising configuring the one or more coils of the passive resonant circuit to comprise two secondary coils wired in series with opposing winding directions.

14. The method as claimed in claim 13, wherein configuring the one or more coils of the passive resonant circuit such the secondary coils of the passive resonant circuit are primarily inductively coupled to different coils of the active tuned resonant circuit respectively.

15. The method as claimed in claim 9, further comprising offsetting, relative to an axis defined by the arrangement of the plurality of keys, active resonant circuits of adjacent keys.

16. The method as claimed in claim 15, wherein the offsetting comprises positioning an active resonant circuit of a first key of the plurality of keys and an active resonant circuit of a second key of the plurality of keys to be on either side of said axis.

* * * * *